United States Patent [19]

Baron et al.

[11] Patent Number: 5,341,113
[45] Date of Patent: Aug. 23, 1994

[54] VOLTAGE CONTROLLED OSCILLATOR HAVING A 50% DUTY CYCLE

[75] Inventors: Nathan Baron, Oranit; Judah L. Adelman, Jerusalem, both of Israel

[73] Assignee: Motorola, Inc., Schaumburg, Ill.

[21] Appl. No.: 84,887

[22] Filed: Jun. 30, 1993

[30] Foreign Application Priority Data

Jul. 2, 1992 [GB] United Kingdom ............... 9214169

[51] Int. Cl.⁵ .................. H03K 3/282; H03L 7/099
[52] U.S. Cl. ..................................... 331/144; 331/34;
331/57; 331/108 A; 331/113 R; 331/173;
331/177 R
[58] Field of Search ............... 331/34, 55, 57, 108 A,
331/111, 113 R, 144, 145, 173, 177 R, 185

[56] References Cited

U.S. PATENT DOCUMENTS

| | | | |
|---|---|---|---|
| 4,623,851 | 11/1986 | Abou et al. | 331/111 |
| 4,623,852 | 11/1986 | Abou et al. | 331/111 |
| 5,233,315 | 8/1993 | Verhoeven | 331/113 R X |

FOREIGN PATENT DOCUMENTS

| | | | |
|---|---|---|---|
| 0985201 | 3/1965 | United Kingdom | H03K 3/50 |
| 1079173 | 8/1967 | United Kingdom | H03K 3/50 |
| 1168682 | 10/1969 | United Kingdom | H03K 3/50 |
| 1196778 | 7/1970 | United Kingdom | H03K 3/50 |
| 1219772 | 1/1971 | United Kingdom | H03K 3/50 |
| 1361428 | 7/1974 | United Kingdom | H03K 3/50 |
| 1459601 | 12/1976 | United Kingdom | H03K 3/50 |
| 1489370 | 10/1977 | United Kingdom | H03K 3/50 |

*Primary Examiner*—David Mis
*Attorney, Agent, or Firm*—Michael D. Bingham; Bradley J. Botsch, Sr.

[57] ABSTRACT

A voltage controlled oscillator (VCO) (2) provides an output signal which has a 50% duty cycle and a frequency which depends on the voltage of a control signal (V) supplied thereto. The VCO (2) comprises first ($C_L$) and second ($C_R$) capacitors and first (3) and second (5) circuits. Each of the first and second circuits comprises a current supply arrangement (10, 12, 14, or 18, 20, 22) coupled to a respective one of the capacitors ($C_L$ or $C_R$) and to receive the control signal (V), and a Schmitt trigger (6 or 16) coupled to the respective current supply arrangement and to the other capacitor, which is not coupled to the respective current supply arrangement. Each current supply arrangement of the first and second circuits alternately charges and discharges the respective capacitor, in dependence on the switching of the respective Schmitt trigger, so that the VCO (2) oscillates between the charging of the first and the charging of the second capacitor. The rate of charging of the first and second capacitors is dependent on the voltage of the control signal (V).

9 Claims, 2 Drawing Sheets

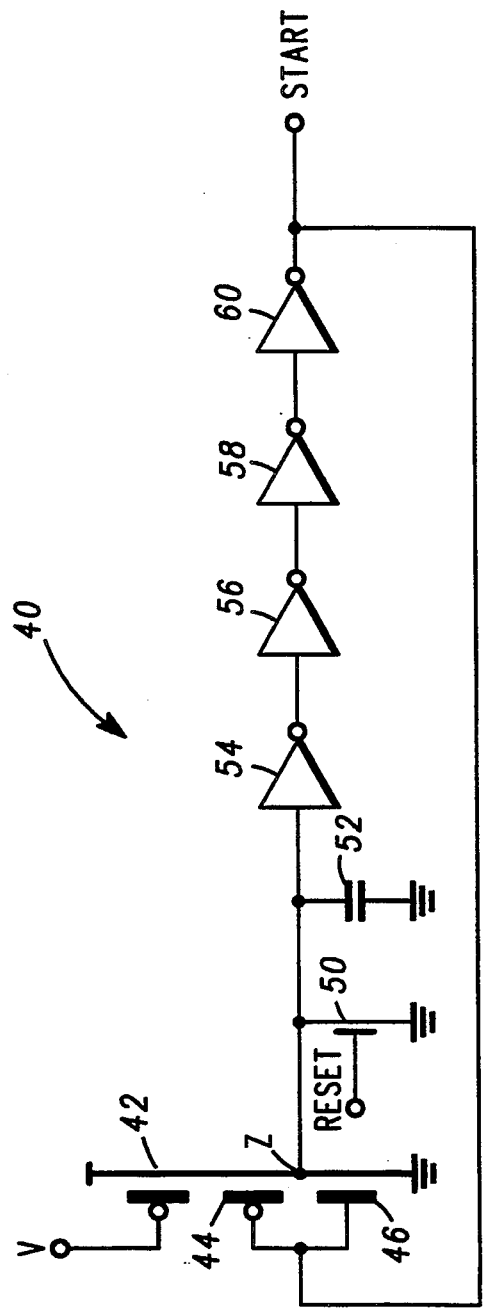

VOLTAGE CONTROLLED OSCILLATOR HAVING A 50% DUTY CYCLE

FIELD OF THE INVENTION

This invention relates to voltage controlled oscillators (VCOs).

BACKGROUND OF THE INVENTION

VCOs are used widely in phase lock loops (PLLs) and for example in microprocessor clock generators. When designing VCOs, the designer aims to provide amongst other things a VCO having low power dissipation and the minimum dependency on production variations. When designing a VCO for a phase lock loop (PLL), in addition to these properties the VCO should also have a 50% duty cycle, a high operating frequency and good controllability. Good controllability is particularly important for the majority of PLLs wherein the VCO receives 'pulse type' phase shift commands. Such pulses can appear at any time during the cycle, depending on circuit delays and process variations etc. Thus, in order to be able to react to these pulses, the VCO should be controllable during the entire cycle.

Ring oscillator structures are well known. This type of VCO typically comprises three or five inverters connected in a ring for providing the oscillations. Two or four of these stages respectively are controllable. This solution suffers from a number of drawbacks: it does not provide a 50% duty cycle, it is comparatively slow since one oscillation cycle requires circling the ring twice which means for a five-inverter ring, for example, passing through ten stages, and there is at least one uncontrollable stage so that during its transition the VCO is not controllable.

PLLs which provide a 50% duty cycle are known. However, they require a double frequency VCO whose output is then divided by 2.

There is therefore a significant need to provide an improved VCO wherein the above drawbacks are obviated.

SUMMARY OF THE INVENTION

In accordance with the present invention there is provided a voltage controlled oscillator (VCO) for providing an output signal, which has a 50% duty cycle and a frequency which depends on the voltage of a control signal supplied thereto. The VCO comprises first and second capacitors and first and second circuits. Each of the first and second circuits comprises a current supply arrangement coupled to a respective one of the capacitors and to receive the control signal, and a Schmitt trigger coupled to the respective current supply arrangement and to the other capacitor, which is not coupled to the respective current supply arrangement. Each current supply arrangement of the first and second circuits alternately charges and discharges the respective capacitor, in dependence on the switching of the respective Schmitt trigger, so that the VCO oscillates between the charging of the first and the charging of the second capacitor. The rate of charging of the first and second capacitors is dependent on the voltage of the control signal.

BRIEF DESCRIPTION OF THE DRAWINGS

A VCO in accordance with a preferred embodiment of the present invention will now be described, by way of example only, with reference to the accompanying diagrams in which:

FIG. 3 is a schematic diagram of a starter circuit for the VCO of FIG. 1.

DETAILED DESCRIPTION OF THE PREFERRED EMBODIMENT

Figure 1:
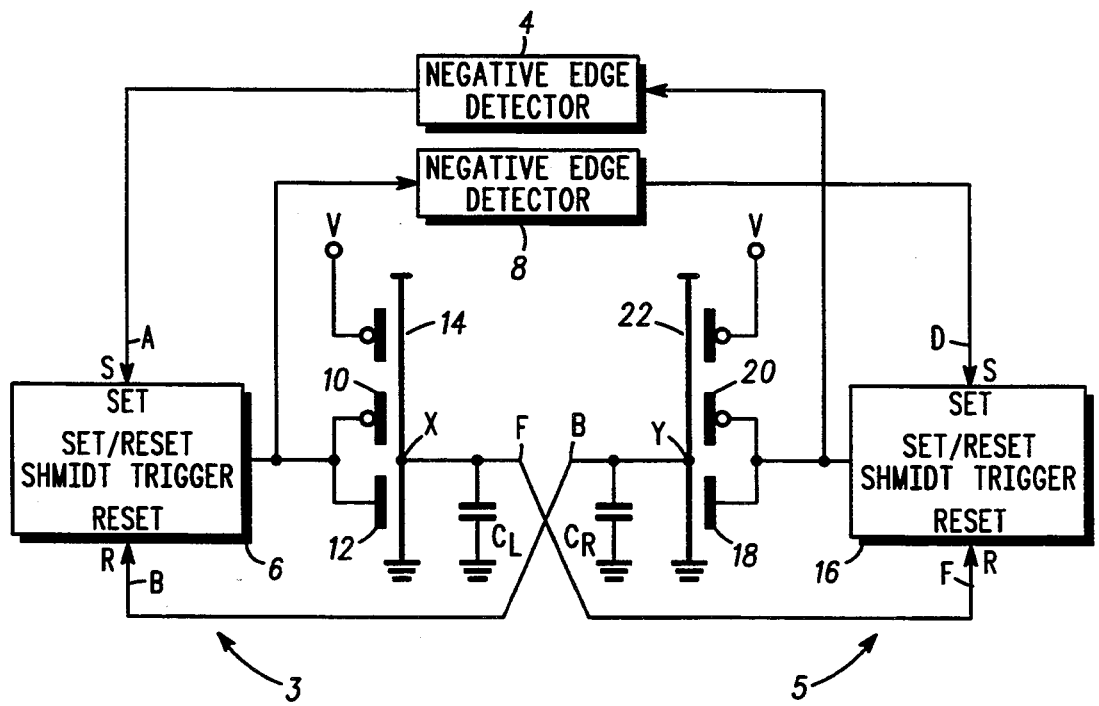
FIG. 1 is a block schematic diagram of a VCO in accordance with the present invention.

Referring firstly to FIG. 1, a VCO 2 in accordance with a preferred embodiment of the present invention comprises a left Schmitt trigger circuit 3 and a right Schmitt trigger circuit 5. The left Schmitt trigger circuit 3 comprises a first Schmitt trigger 6 having a set input S coupled to an output of a first negative edge detector 4 and a trigger output coupled to an input of a second negative edge detector 8 and to the gate electrodes of a p-channel FET 10 and a n-channel FET 12. The first p-channel FET 10 and the n-channel FET 12 are coupled in series with a second p-channel FET 14 whose gate electrode is coupled to receive the control voltage V. The drain electrode of the first p-channel FET 10 is coupled to the drain electrode of the n-channel FET 12 at a node X. A capacitor $C_L$ is coupled between node X and ground. Node X is also coupled to the reset input R of a second Schmitt trigger 16 which is part of the right Schmitt trigger circuit 5.

The second Schmitt trigger 16 has a set input S coupled to the output of the second negative edge detector 8 and a trigger output coupled to the input of the first negative edge detector 4 and to the gate electrodes of a p-channel FET 20 and a n-channel FET 18. The first p-channel Flit 20 and the n-channel FET 18 are coupled in series with a second p-channel FET 22 whose gate electrode is coupled to receive the control voltage V. The drain electrode of the first p-channel FET 20 is coupled to the drain electrode of the n-channel FET 18 at node Y. A capacitor $C_R$ is coupled between node Y and ground. Node Y is also coupled to the reset input R of the first Schmitt trigger 6.

Figure 2:
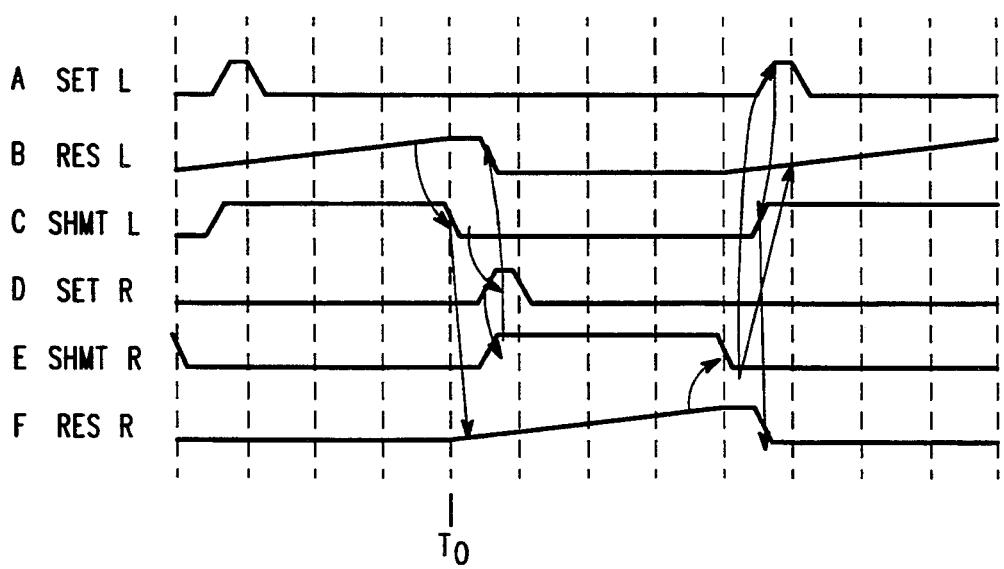
FIG. 2 is a timing diagram for the VCO of FIG. 1.

The operation of the VCO 2 will now be described with reference to the timing diagrams shown in FIG. 2. The diagrams A-F of FIG. 2 represent the change in the signals at the respective nodes A-F of FIG. 1 with time.

Assuming that the first Schmitt trigger 6 has been reset (at $T_0$) in which case the trigger output of the first Schmitt trigger 6 (see C of FIG. 2) goes from a high level to a low level, the capacitor $C_L$ starts being charged (see F of FIG. 2) by the current flowing through the 'on' p-channel FETs 10 and 14 and the voltage at node F rises. The rate of charging of capacitor $C_L$ is dependent on the control voltage V on the gate electrode of second p-channel FET 14. The second negative edge detector 8 in response to detecting the trigger output going low, produces a narrow pulse that sets the second Schmitt trigger 16. As a result, the trigger output of the set second Schmitt trigger goes high, the n-channel FET 18 is switched 'on' and the capacitor $C_R$ discharges.

When the voltage on the capacitor $C_L$ reaches the operating point of the second Schmitt trigger 16, the second Schmitt trigger 16 is reset and the above procedure is repeated with the operation of the left 3 and right 5 Schmitt trigger circuits reversed. That is, the trigger output of the second Schmitt trigger 16 goes low so that the capacitor $C_R$ starts being charged by the current flowing through the 'on' p-channel FETs 20 and 22 under the control of the voltage V. The first negative edge detector 4 produces a narrow pulse in response to the resetting of the second Schmitt trigger 16 that sets the first Schmitt trigger 6. The capacitor $C_L$ is discharged in response thereto and the left Schmitt trigger circuit 3 is prepared to accept the reset signal which is generated once the voltage on the capacitor $C_R$ reaches the operating point of the first Schmitt trigger 6.

The output signals of the oscillating VCO 2, which can be taken from nodes A or D for example, are pulsed signals.

Since the VCO 2 in accordance with the invention is symmetrical, the output signal has a 50% duty cycle. Furthermore, the VCO is controllable at any point in the oscillation cycle since the Schmitt triggers are very fast and therefore during almost the entire cycle either the right $C_R$ or left $C_L$ capacitor is being charged. The charging rate of $C_L$ and $C_R$ is dependent on the control voltage V. In addition, the remainder of the cycle, which is composed of the Schmitt trigger transition time, is controlled by the rate of change of the signals at nodes B and F and this is also controllable. The VCO 2 can also reach very high frequencies because only four stages (two Schmitt triggers and two controlled devices) are required for one oscillation cycle compared with the prior art's ten stages.

Since the VCO 2 may have stable initial conditions during power up, in order to start the VCO 2 oscillating a starter circuit such as the simple ring oscillator circuit shown in FIG. 3 is used.

The starter circuit 40 comprises a first p-channel FET 42 coupled in series with a second p-channel FET 44 and a n-channel FET 46. The gate electrode of the first p-channel FET 42 receives the control voltage V. The gate electrodes of the second p-channel FET 44 and the n-channel FET 46 are coupled to an output START of the starter circuit 40. The signal at the output START is applied to both the first 6 and second 16 Schmitt triggers. The drain electrode of the second p-channel FET 44 is coupled to the drain electrode of the n-channel FET 46 at a node Z. A second n-channel FET 50 is coupled between node Z and ground and has a gate electrode coupled to the output A of the VCO 2. A capacitor 52 is coupled between node Z and ground. Four inverters 54–60 are coupled in series between the node Z and the output START of the starter circuit 40.

The starter circuit 40 is also controlled by the control voltage V applied to the gate electrode of the first p-channel FET 42. However, it is a much slower oscillator than the VCO circuit 2. On start-up in response to a control pulse V, the starter circuit begins to oscillate whereby the signal at the output START forces the VCO 2 to an unstable condition. Once the VCO 2 is oscillating, the signal at the output node A resets the starter circuit every oscillation cycle and so prevents further operation of the starter circuit 40.

In summary, the present invention provides an improved voltage controlled oscillator circuit (VCO) which has a 50% duty cycle, full controllability over the whole oscillation cycle and extremely fast operation.

We claim:

1. A CMOS voltage controlled oscillator (VCO) for providing an output signal whose frequency depends on the voltage of a control signal supplied thereto, the VCO comprising:

first and second capacitors; and first and second circuits for alternately charging and discharging said first and second capacitors respectively so that the VCO oscillates between the charging of the first and the charging of the second capacitor, the first and second circuits charging the respective first and second capacitors at a rate which depends on the voltage of the control signal, wherein the first circuit comprises a first current supply means coupled to the first capacitor and to receive the control signal and a first Schmitt trigger having a reset input coupled to the second capacitor, a set input, and a switching output for providing a switching signal to the first current supply means, wherein the second circuit comprises a second current supply means coupled to the second capacitor and to receive the control signal, and a second Schmitt trigger having a reset input coupled to the first capacitor, a set input, and a switching output for providing a switching signal to the second current supply means, wherein the first Schmitt trigger is reset when the voltage on the second capacitor reaches a threshold voltage of the first Schmitt trigger whereby the switching signal switches the first current supply means to a charging state in which the first current supply means charges the first capacitor, and the second Schmitt trigger is reset when the voltage on the first capacitor reaches a threshold voltage of the second Schmitt trigger whereby the switching signal switches the second current supply means to a charging state in which the second current supply means charges the second capacitor, and wherein the first Schmitt trigger is set when the second current supply means switches to the charging state whereby the switching signal switches the first current supply means to a discharging state in which the first capacitor is discharged, and the second Schmitt trigger is set when the first current supply means switches to the charging state whereby the switching signal switches the second current supply means to a discharging state in which the second capacitor is discharged.

2. The VCO according to claim 1 wherein the first circuit further comprises a first signal transition detector coupled between the switching output of the second Schmitt trigger and the set input of the first Schmitt trigger for providing a set signal thereto for setting the first Schmitt trigger in response to detecting a transition of the switching signal of the second Schmitt trigger when the switching signal switches the second current supply means to the charging state and wherein the second circuit further comprises a second transition detector coupled between the switching output of the first Schmitt trigger and the set input of the second Schmitt trigger for providing a set signal thereto for setting the second Schmitt trigger in response to detecting a transition of the switching signal of the first Schmitt trigger when the switching signal switches the first current supply means to the charging state.

3. The VCO according to claim 2 wherein the transition is a falling edge.

4. The VCO according to claim 1 wherein the first current supply means comprises:

a first p-channel transistor having a gate electrode coupled to receive the control signal, source electrode coupled to a first power supply line and a drain electrode;

a second p-channel transistor having a source electrode coupled to the drain electrode of the first p-channel transistor, a gate electrode coupled to the switching output of the first Schmitt trigger and a drain electrode coupled to a first node; and a n-channel transistor having a gate electrode coupled to the switching output of the first Schmitt trigger, a source electrode coupled to a second power supply line and a drain electrode coupled to the first node, the first node being coupled to the first capacitor.

5. The VCO according to claim 1 wherein the second current supply means comprises:

a first p-channel transistor having a gate electrode coupled to receive the control signal, a source electrode coupled to a first power supply line and a drain electrode;

a second p-channel transistor having a source electrode coupled to the drain electrode of the first p-channel transistor, a gate electrode coupled to the switching output of the second Schmitt trigger and a drain electrode coupled to a second node; and n-channel transistor having a gate electrode coupled to the switching output of the second Schmitt trigger, a source electrode coupled to a second power supply line and a drain electrode coupled to the second node, the second node being coupled to the second capacitor.

6. The VCO according to claim 1 further comprising a starter oscillator circuit coupled to the first and second Schmitt triggers for starting the VCO oscillating, the starter oscillator circuit oscillates on application of the control signal and is thereafter reset in response to the first or second Schmitt trigger being set.

7. A CMOS voltage controlled oscillator (VCO) for providing an output signal whose frequency depends on the voltage of a control signal supplied thereto, the VCO comprising:

first and second capacitors; and first and second circuits for alternately charging and discharging said first and second capacitors respectively so that the VCO oscillates between the charging of the first and the charging of the second capacitor, the first and second circuits charging the respective first and second capacitors at a rate which depends on the voltage of the control signal, wherein the first circuit comprises a first current supply means coupled to the first capacitor and to receive the control signal and a first Schmitt trigger having a reset input coupled to the second capacitor, a set input, and a switching output for providing a switching signal to the first current supply means, the first current supply means comprising:

a first p-channel transistor having a gate electrode coupled to receive the control signal, a source electrode coupled to a first power supply line and a drain electrode;

a second p-channel transistor having a source electrode coupled to the drain electrode of the first p-channel transistor, a gate electrode coupled to the switching output of the first Schmitt trigger and a drain electrode coupled to a first node; and a first n-channel transistor having a gate electrode coupled to the switching output of the first Schmitt means, a source electrode coupled to a second power supply line and a drain electrode coupled to the first node, the first node being coupled to the first capacitor, and wherein the second circuit comprises a second current supply means coupled to the second capacitor and to receive the control signal, and a second Schmitt trigger having a reset input coupled to the first capacitor, a set input, and a switching output for providing a switching signal to the second current supply means, the second current supply means comprising:

a third p-channel transistor having a gate electrode coupled to receive the control signal, a source electrode coupled to the first power supply line and a drain electrode;

a fourth p-channel transistor having a source electrode coupled to the drain electrode of the third p-channel transistor, a gate electrode coupled to the switching output of the second Schmitt trigger and a drain electrode coupled to a second node; and a second n-channel transistor having a gate electrode coupled to the switching output of the second Schmitt trigger, a source electrode coupled to the second power supply line and a drain electrode coupled to the second node, the second node being coupled to the second capacitor, and wherein the first Schmitt trigger is reset when the voltage on the second capacitor reaches a threshold voltage of the first Schmitt trigger whereby the switching signal switches the first current supply means to a charging state in which the first and second p-channel transistors are conducting such that the first current supply means charges the first capacitor, and the second Schmitt trigger is reset when the voltage on the first capacitor reaches a threshold voltage of the second Schmitt trigger whereby the switching signal switches the second current supply means to a charging state in which the third and fourth p-channel transistors are conducting such that the second current supply means charges the second capacitor, and wherein the first Schmitt trigger is set when the second current supply means switches to the charging state whereby the switching signal switches the first current supply means to a discharging state in which the first n-channel transistor is conducting such that the first capacitor is discharged, and the second Schmitt trigger is set when the first current supply means switches to the charging state whereby the switching signal switches the second current supply means to a discharging state in which the second n-channel transistor is conducting such that the second capacitor is discharged.

8. The VCO according to claim 7 wherein the first circuit further comprises a first signal transition detector coupled between the switching output of the second Schmitt trigger and the set input of the first Schmitt trigger for providing a set signal thereto for setting the first Schmitt trigger in response to detecting a transition of the switching signal of the second Schmitt trigger when the switching signal switches the second current supply means to the charging state and wherein the second circuit further comprises a second transition detector coupled between the switching output of the first Schmitt trigger and the set input of the second Schmitt trigger for providing a set signal thereto for setting the second Schmitt trigger in response to detecting a transition of the switching signal of the first Schmitt trigger when the switching signal switches the first current supply means to the charging state.

9. The VCO according to claim 8 wherein the transition is a falling edge.

* * * * *